United States Patent [19]

Asano

[11] Patent Number: 4,588,669
[45] Date of Patent: May 13, 1986

[54] PHOTOSENSITIVE LITHOGRAPHIC PLATE WITH DIAZO RESIN UNDERLAYER AND POLYVINYL ACETAL RESIN WITH AZIDE IN SIDE CHAIN OVERLAYER

[75] Inventor: Takateru Asano, Sakura, Japan

[73] Assignee: Fuji Chemicals Industrial Co., Ltd., Tokyo, Japan

[21] Appl. No.: 608,457

[22] Filed: May 9, 1984

[30] Foreign Application Priority Data

May 12, 1983 [JP] Japan ................................ 58-83305

[51] Int. Cl.$^4$ ..................... G03C 1/60; G03C 1/71; G03F 7/08
[52] U.S. Cl. ..................... 430/156; 430/145; 430/162; 430/167; 430/175; 430/176; 430/194; 430/195; 430/302
[58] Field of Search ............... 430/156, 195, 162, 167, 430/145, 302, 194, 175, 176

[56] References Cited

U.S. PATENT DOCUMENTS

| | | | |
|---|---|---|---|
| 3,808,004 | 4/1974 | Thomas et al. | 430/156 |
| 3,817,757 | 6/1974 | Yabe et al. | 430/194 |
| 4,104,072 | 8/1978 | Golda et al. | 430/175 |
| 4,123,276 | 10/1978 | Kita et al. | 430/176 |
| 4,191,573 | 3/1980 | Toyoma et al. | 430/156 |
| 4,263,392 | 4/1981 | Jones | 430/156 |
| 4,413,091 | 11/1983 | Iwasaki et al. | 430/195 |

FOREIGN PATENT DOCUMENTS

| | | | |
|---|---|---|---|
| 55-140844 | 11/1980 | Japan | 430/195 |
| 81-06530 | 2/1981 | Japan | 430/145 |
| 1274017 | 5/1972 | United Kingdom | 430/156 |

*Primary Examiner*—Charles L. Bowers, Jr.
*Attorney, Agent, or Firm*—Parkhurst & Oliff

[57] ABSTRACT

A photosensitive lithographic plate comprising a hydrophilic substrate, a photosensitive diazo resin layer superposed on the substrate, and a layer of a photosensitive polyvinyl acetal resin containing an aromatic azide group in a side chain thereof and having an acid number of 10 to 100 and superposed on the diazo resin layer, and a method for the manufacture of this photosensitive lithographic plate.

8 Claims, No Drawings

PHOTOSENSITIVE LITHOGRAPHIC PLATE WITH DIAZO RESIN UNDERLAYER AND POLYVINYL ACETAL RESIN WITH AZIDE IN SIDE CHAIN OVERLAYER

BACKGROUND OF THE INVENTION

1. Field of the Invention

This invention relates to a photosensitive lithographic plate (hereinafter referred to as "PS plate"), and more particularly to a PS plate of negative type photopolymer.

2. Description of the Prior Art

Diazo type photosensitive materials are often used for photosensitive layers of PS plates. Examples of known diazo type photosensitive materials include, o-naphthoquinone diazide used in positive type PS plates and a condensate of 4-diazo-diphenylamine, 3-methoxy-4-diazo-diphenylamine, or 2,5-diethoxy-4-diazo(tolylmercapto)-benzene with paraformaldehyde used in negative type PS plates.

By using a mixture of a diazo resin and another high molecular weight compound, a lithographic printing plate can be produced that can withstand the impacts of printing without requiring any lacquer padding and can be easily developed with an aqueous developing liquid that contains a surface active agent. Diazo resins are used in large amounts for photosensitive layers of negative type PS plates. The diazo resin used in the production of such PS plates is in a water-insoluble form, as disclosed in the specification of Japanese Patent Application Publication No. 47(1972)-1167 to provide enhanced storage stability of the PS plates. The diazo resin, however, is vulnerable to heat and moisture when prepared in the form of a solution. For this reason, negative type PS plates using a diazo resin are inferior to PS plates using solvent-developing type photopolymers with respect to properties such as the stability to withstand aging due to production lot, the strength of formed image, and the resistance to impacts of printing.

When the diazo resin is mixed with another high molecular weight compound, the resultant photosensitizing solution is unstable at room temperature and must be used within several hours to several days after the diazo resin and the high molecular weight compound are mixed. Further, when the diazo photosensitizing solution is mechanically kneaded as with a roller coater, the decomposition of the diazo compound is accelerated so that the photosensitizing solution becomes unusable in several hours.

Thus, from the moment the diazo resin is dissolved in the solvent, its decomposition steadily proceeds with elapse of time. The diazo photosensitizing solution having a high molecular weight compound mixed therein is very difficult to preserve. The production of PS plates using such diazo photosensitizing solutions is extremely difficult in the summer when temperature and humidity are high.

SUMMARY OF THE INVENTION

It is therefore an object of this invention to provide a photosensitive lithographic plate which can be as easily and safely developed with a weak aqueous alkali solution containing a surface active agent as any conventional diazo-based negative PS plate.

Another object of this invention is to provide a negative PS plate that is comparable to conventional PS plates of the photopolymer type with respect to properties such as the stability to withstand aging, the strength of formed image, and the resistance to impacts of printing.

Yet another object of this invention is to provide a method for the manufacture of a photosensitive lithographic plate possessing the characteristics mentioned above.

More specifically, in accordance with this invention, a photosensitive lithographic plate is provided which comprises a hydrophilic substrate, a photosensitive diazo resin layer superposed on said substrate, and a layer of photosensitive polyvinyl acetal resin containing an aromatic azide group in a side chain thereof and having an acid number of 10 to 100, said layer of photosensitive polyvinyl acetal resin being superposed on said photosensitive diazo resin layer.

Furthermore, in accordance with this invention, a method for the manufacture of a photosensitive lithographic plate is provided which comprises applying a solution containing a photosensitive diazo resin to a hydrophilic substrate, allowing the applied layer of said resin solution to dry, thereby forming an applied layer of resin, then applying to said applied layer of resin, a solution containing a photosensitive polyvinyl acetal resin containing an aromatic azide group in a side chain thereof and having an acid number of 10 to 100, and allowing the applied layer of said resin solution to dry, thereby forming an applied layer of resin.

DETAILED DESCRIPTION OF THE INVENTION

The diazo resin used in this invention is applied as dissolved in a solvent. The solution is made so that the diazo resin which has undergone steady decomposition with elapse of time can be readily removed from the solution by filtration. The PS plate of this invention, therefore, does not entail a loss of photosensitizing solution through discarding which inevitably accompanies conventional PS plates because they use a diazo type photosensitizing solution which incorporates a high molecular weight compound. The PS plate of this invention isolates the diazo resin layer from the ambient air by the upper layer of photopolymer, thereby preventing the otherwise inevitable decomposition of the diazo compound by humidity. Thus, the PS plate produced according to this invention enjoys high stability.

The hydrophilic substrate to be used for the present invention comprises a base plate having a surface such that the PS plate using this base plate receives moisture from the damping water and repels the printing ink when set in place in a lithographic press operated under standard printing conditions. When the substrate to be used is made of paper or plastic, the surface of the substrate is made hydrophilic by coating it with a resin containing a hydrophilic group or by subjecting it to a suitable chemical treatment. When the substrate is made of a metal, particularly aluminum, the substrate is preferably subjected to a suitable surface treatment such as, for example, a graining treatment, an immersion treatment using an aqueous solution of sodium silicate or potassium zirconate fluoride, or an anodizing treatment.

The photosensitive diazo resin to be used in this invention is obtained by first preparing a film-forming diazo resin by the condensation of a salt of a diazo compound such as 4-diazodiphenylamine, 3-methoxy-4-diazodiphenylamine, or 2,5-diethoxy-4-diazo(tolylmercapto)-benzene with a condensing agent such as paraformaldehyde or 4,4'-bis-(methoxymethyl)-diphenyl ether, and then converting this diazo resin into a corresponding salt such as a hexafluorophosphate, tetrafluoroborate, p-toluene sulfonate, mesitylene sulfonate, or 2-hydroxy-4-methoxybenzophenone-5-sulfonate salt, which is put to use in an isolated form. This photosensitive diazo resin is dissolved in water or in an organic solvent such as methanol, methyl cellosolve (i.e., methoxyethanol), dimethyl formamide, or γ-butyrolactone and is then applied to the surface of a substrate. The photosensitive diazo resin may be applied to the surface of a substrate by means of application such as a whirler. The diazo resin is preferably applied in a quantity such that the finished layer thereof, when dried, has a thickness of not more than 0.5 μm, and preferably not more than 0.3 μm. Any excess of this thickness only results in an increase in development time.

The photosensitive polyvinyl acetal resin to be used in this invention is produced by converting a polyvinyl alcohol of a polymerization degree of 300 to 3000, preferably 500 to 1700, and most preferably 800 to 1100, into a corresponding acetal. The conversion is effected by reacting the polyvinyl alcohol with an azidoaryl aldehyde such as p-azidobenzaldehyde, p-azidocinnamicaldehyde, or 1-azido-5-formyl naphthalene in glacial acetic acid, and thereafter esterifying the resultant acetal with an acid anhydride such as succinic anhydride, maleic anhydride, phthalic anhydride, or trimellitic anhydride. Alternatively, the photosensitive polyvinyl acetal resin may be produced by hydrolyzing a polyvinyl acetate with a mineral acid in methanol and, at the same time, converting the resultant hydrolyzate into a corresponding acetal with an azidoaryl aldehyde and esterifying the resultant acetal with an acid anhydride.

The acid number of the photosensitive polyvinyl acetal resin is desired to fall in the range of 10 to 100 and preferably in the range of 40 to 70. If the acid number is less than 10, development by a weak aqueous alkali solution containing a surface active agent proceeds so slowly that the non-image portion of the developed plate will tend to be smeared with printing ink. If the acid number exceeds 100, the oil-sensitivity of the image portion of the plate becomes too low and, as a result, the photosensitive polyvinyl acetal resin may not be advantageously used as a photosensitive layer in the lithographic plate.

For the conversion of polyvinyl alcohol or polyvinyl acetate into a corresponding acetal, the azidoaryl aldehyde is used in an amount of 5 to 50 mol%, preferably 20 to 45 mol%, based on the amount of the polyvinyl alcohol or polyvinyl acetate. If this amount is less than 5 mol%, the resultant polyvinyl acetal resin may not have sufficient photosensitivity. For the purpose of enabling the photosensitive polyvinyl acetal resin to have improved resistance to impacts of printing and improved oil sensitivity, the azidoaryl aldehyde to be used in this conversion may incorporate therein butylaldehyde, benzaldehyde or the like in a small amount, for example, of 2.5 to 20 mol%.

The photosensitive polyvinyl acetal resin thus obtained is prepared for use by being dissolved in a solvent which does not tend to dissolve the underlying diazo resin layer such as ethyl cellosolve (i.e., ethoxyethanol), methylethyl ketone, or cyclohexanone and then, according to need, mixed with 5 to 15% by weight, preferably 7 to 12% by weight, of a sensitizer such as Michler's ketone, 1,2-benzanthraquinone, 5-nitroacenaphthene, N-acetyl-4-nitro-1-naphthylamine, 2-nitrofluorenone, Michler-thioketone, N-phenyl thioacridone, eosin, or 2-benzoyl-1-methyl-β-naphthothiazoline. Optionally, the photosensitive polyvinyl acetal resin may incorporate a dye, a plasticizer, a radical generating agent or the like, to enhance the properties of the PS plate to be finally obtained.

The layer of the photosensitive polyvinyl acetal resin has a thickness of from 0.5 to 2.0 μm, and preferably of from 0.8 to 1.2 μm.

The photosensitive polyvinyl acetal resin layer used in the photosensitive lithographic plate of this invention can be developed with a weak aqueous alkali solution even in the absence of the underlying diazo resin layer. The photosensitive polyvinyl acetal resin layer, however, has poor adhesiveness to the substrate having a hydrophilic surface when the underlying diazo resin layer is absent, and tends to cause separation of the image portion during the course of printing. If the photosensitive polyvinyl acetal resin layer is sufficiently heat dried to improve the adhesiveness of the layer, the non-image portion of the layer tends to be smeared with ink after the development process. The photosensitive diazo resin layer formed as an intermediate layer in the lithographic plate of this invention, improves the adhesiveness of the aforementioned photosensitive polyvinyl acetal resin layer to the substrate having a hydrophilic surface and prevents the smearing of the developed surface with ink.

Japanese Patent Application Laid-Open No. 55(1980)-18621 discloses a method for producing a photosensitive lithographic plate by applying a photosensitive diazo resin to a substrate possessing a hydrophilic surfaces and forming on the applied layer of this diazo resin a non-photosensitive lipophilic resin layer as an ink-receptive layer. In accordance with this method, a lithographic plate is prepared for printing by allowing developer to penetrate the plate until it reaches the lower diazo resin layer thus swelling the diazo resin layer, and then the non-image portion of the developed surface is thereafter physically rubbed off. This lithographic plate poses problems with respect to developing properties and image quality. When the upper layer is not photosensitive and dissolves in the developer, the image formation is effected in the lower diazo resin layer, and hence, the upper lipophilic resin layer cannot have a sufficient thickness to offer improved resistance to printing impacts.

In the lithographic plate of this invention, however, the development is effected by having both the photopolymer layer and the photosensitive diazo resin layer simultaneously dissolved by a weak aqueous alkali solution containing a surface active agent, so that it appears as though the development were occurring in just one photopolymer layer. Further, the image portion of the developed layers shows an excellent photosetting property. Thus, the lithographic plate enjoys high resistance to the impacts of printing and has highly stable qualities.

The photosensitive polyvinyl acetal resin to be used in the present invention may be mixed with a photosensitive diazo resin to produce a photosensitive layer in the negative PS plate that is highly resistant to the impacts of printing. If the two resins are used in this manner, however, the management of the photosensitizing solution to be used for the negative PS plate will be as difficult as is experienced with the conventional diazo type photosensitizing solution.

For the development of the negative PS plate of this invention, it is desirable to use a developer which comprises an aqueous solution containing an anionic surface active agent, benzyl alcohol, an alkali agent, and a water-soluble sulfite as disclosed in Japanese Patent Application Publication Nos. 56(1981)-39464 and 56(1981)-42860 or a developer which comprises an aqueous solution containing phenyl cellosolve (i.e., phenoxyethanol), an amine-adducted salt of benzotriazole and a surface active agent as disclosed in Japanese Patent Application Laid-Open No. 55(1980)-138740.

The present invention will now be described in more detail with reference to working examples. It should be noted, however, that the present invention is not limited only to these working examples.

EXAMPLE 1

(1) Synthesis of photosensitive polyvinyl acetal resin 200 ml of glacial acetic acid was placed in a three-neck round flask having an inner volume of 1 liter and equipped with a thermometer, a reflux condenser, and a stirrer. 15.8 g of polyvinyl alcohol (having a polymerization degree of 1000 and a saponification degree of 98 mol%), 13.2 g of p-azidobenzaldehyde, and 0.45 g of benzaldehyde were added with stirring into the glacial acetic acid in the presence of 5.4 ml of an aqueous 33% sulfuric acid solution as a catalyst, and heated at 55° C. for 3 hours to effect acetalization. After completion of the reaction, the reaction mixture was cooled, diluted with ethanol, and poured into a large volume of cold water. The resin consequently separated out in the water, was separated by filtration and dried in a vacuum until the water content became less than 1%. The amount of the resin thus obtained was 26 g.

Next, 25 g of the polyvinyl azidobenzal resin was dissolved in 250 ml of glacial acetic acid. The resultant solution and 42 g of anhydrous sodium acetate, 5.9 g of succinic anhydride, and 21.6 g of phthalic anhydride added thereto were stirred at 95° C. for 3 hours to effect esterification. After completion of the reaction, the reaction mixture was cooled, diluted with ethanol and poured with stirring into a large volume of cold water. The resin which consequently separated out in the water was filtered out and dried in a vacuum. The amount of the resin thus obtained was 32 g. The photosensitive polyvinyl acetal resin thus synthesized had an acid number of 48.

(2) Production of negative PS plate

An aluminum sheet having a thickness of 0.3 mm had its surface coarsened by the use of a nylon brush and abrasive sand. The aluminum sheet was immersed in an aqueous 10% sodium hydroxide solution for 10 seconds, washed with cold water, then immersed in an aqueous 10% nitric acid solution for 5 seconds to effect surface-treating, and then washed with cold water. Further, this aluminum sheet was subjected to anodizing in an aqueous 20% sulfuric acid solution at a current density of 2 A/dm$^2$ for 2 minutes and rinsed with cold water. It was then treated with an aqueous solution of 5% sodium silicate, No. 3 ($Na_2O.3SiO_2$), at 70° C. for 15 seconds, washed with cold water, and dried. Subsequently, a photosensitive diazo resin solution of the following composition was applied to the surface of the aluminum sheet with the aid of a whirler and dried at 60° C. for 3 minutes. The photosensitive diazo resin layer formed had a thickness of 0.2 μm.

Composition Of Photosensitive Diazo Resin Solution

Methyl cellosolve: 25 g
Dimethyl formamide: 2 g
The 2-Hydroxy-4-methoxybenzophenone-5-sulfonate salt of a condensate between 4-diazodiphenylamine and paraformaldehyde: 0.5 g Next, a photopolymer photosensitizing solution of the following composition was applied to the anodized aluminum sheet having the photosensitive diazo resin layer applied thereto, with the aid of a whirler and then dried at 80° C. for 3 minutes, to obtain a PS plate. The photopolymer layer thus formed had a thickness of 1.2 μm.

Composition Of Photopolymer Photosensitizing Solution

Ethyl cellosolve: 96 g
Photosensitive polyvinyl acetal resin: 4 g
5-Nitroacenaphthene: 0.4 g
Victoria pure blue—BOH, "Basic Blue 7" (tradename for a triphenylmethane-based dye, manufactured by Hodogaya Chemicals Industrial Co., Ltd.): 0.12 g A negative film was held intimately against the negative PS plate obtained as described above and exposed to the light from a high-pressure mercury vapor lamp of 1 KW at an intensity of 2.2 mW/cm$^2$ for 1 minute. The negative PS plate was subjected to vat development using a developer of the following composition at 25° C. for 30 seconds and then washed with cold water. Consequently, there was obtained a lithographic plate bearing a clear positive image.

Composition Of Developer

Phenyl cellosolve: 12 g
Benzotriazole triethanolamine-adducted salt: 3 g
Sodium isopropylnaphthalene sulfonate: 6 g
Water: 250 g The negative PS plate produced by the method described above showed no ink smear on the non-image portion during the course of development even after it had been left standing at 40° C. and 75% humidity for 10 days or more. When this plate was set in place in an offset printing press and used for printing, it stably produced more than 100,000 prints.

EXAMPLE 2

The photosensitive diazo resin solution prepared according to Example 1 was left standing at 25° C. for 7 days, it then filtered through a sheet of Toyo Filter Paper No. 2 (tradename for filter paper having a pore size of 10μ, manufactured by Toyo Roshi Co., Ltd.), and used in the production of a negative PS plate by the same procedure as described in Example 1. The PS plate consequently obtained had the same grade of quality as the product obtained in Example 1.

What is claimed is:

1. A photosensitive lithographic plate, comprising:
   (a) a hydrophilic substrate;
   (b) a photosensitive diazo resin layer superposed on said substrate, said photosensitive diazo resin being obtained by the condensation of a salt of a diazo compound selected from the group consisting of 4-diazo-diphenylamine, 3-methoxy-4-diazo-diphenylamine, and 2,5-diethoxy-4-diazo-(tolyl-mercapto)-benzene with a condensing agent such as paraformaldehyde or 4,4'-bis-(methoxymethyl)-diphenyl ether; and (c) a layer of photosensitive polyvinyl acetal resin having an acid number of 10 to 100 and containing an aromatic azide group in a side chain thereof, said layer of photosensitive polyvinyl acetal resin being superposed on said photosensitive diazo resin layer, said photosensitive polyvinyl acetal resin being produced by acetalizing a polyvinyl alcohol having a polymerization degree of 300 to 3000 with an azidoaryl aldehyde selected from the group consisting of p-azidobenzaldehyde, p-azidocinnamicaldehyde, and 1-azide-5-formyl naphthalene and subsequently esterifying the resultant acetal with at least one acid anhydride selected from the group consisting of succinic anhydride, maleic anhydride, phthalic anhydride, and trimellitic anhydride.

2. A photosensitive lithographic plate according to claim 1, wherein said photosensitive diazo resin comprises a diazo resin obtained by the condensation of a salt of a diazo compound selected from the group consisting of 4-diazo-diphenylamine, 3-methoxy-4-diazodiphenylamine, and 2,5-diethoxy-4-diazo(tolyl-mercapto)-benzene with a condensing agent such as paraformaldehyde or 4,4'-bis-(methoxymethyl)-diphenyl ether.

3. A photosensitive lithographic plate according to claim 2, wherein said photosensitive diazo resin comprises a condensate of 4-diazo-diphenylamine with paraformaldehyde or a salt thereof.

4. A photosensitive lithographic plate according to claim 1, wherein said photosensitive diazo resin layer has a thickness of not more than 0.5 $\mu$m.

5. A photosensitive lithographic plate according to claim 1, wherein said photosensitive polyvinyl acetal resin is produced by acetalizing a polyvinyl alcohol having a polymerization degree of 300 to 3000 with p-azide-benzaldehyde and thereafter esterifying the resultant acetal with an acid anhydride selected from the group consisting of succinic anhydride and phthalic anhydride.

6. A photosensitive lithographic plate according to claim 1, wherein said photosensitive polyvinyl acetal resin layer contains a total of 5 to 15% by weight of a sensitizer.

7. A photosensitive lithographic plate according to claim 6, wherein said photosensitive polyvinyl acetal resin layer further contains at least one adjuvant selected from the group consisting of dyes, plasticizers and radical generating agents.

8. A photosensitive lithographic plate according to claim 1, wherein said photosensitive polyvinyl acetal resin layer has a thickness of from 0.5 to 2.0 $\mu$m.

* * * * *